United States Patent
Brox et al.

(10) Patent No.: US 11,043,255 B2
(45) Date of Patent: *Jun. 22, 2021

(54) MEMORY DEVICE WITH IMPROVED WRITING FEATURES

(71) Applicant: MICRON TECHNOLOGY, INC., Boise, ID (US)

(72) Inventors: Martin Brox, Munich (DE); Milena Ivanov, Unterhaching (DE)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/899,381

(22) Filed: Jun. 11, 2020

(65) Prior Publication Data

US 2020/0302992 A1   Sep. 24, 2020

Related U.S. Application Data

(63) Continuation of application No. 16/138,346, filed on Sep. 21, 2018, now Pat. No. 10,726,905.

(51) Int. Cl.
*G11C 11/4076* (2006.01)
*G11C 11/4091* (2006.01)
*G11C 11/4094* (2006.01)

(52) U.S. Cl.
CPC ...... *G11C 11/4076* (2013.01); *G11C 11/4091* (2013.01); *G11C 11/4094* (2013.01)

(58) Field of Classification Search
CPC ............ G11C 11/4076; G11C 11/4091; G11C 11/4094; G11C 2207/229; G11C 2207/002; G11C 2207/005; G11C 7/1096
See application file for complete search history.

(56) References Cited

U.S. PATENT DOCUMENTS

| | | | |
|---|---|---|---|
| 6,597,627 B2 | 7/2003 | Arata et al. | |
| 6,930,939 B2 | 8/2005 | Lim et al. | |
| 7,376,041 B2 | 5/2008 | Jang | |
| 8,295,113 B2 | 10/2012 | Nakaoka | |
| 10,726,905 B2 * | 7/2020 | Brox | G11C 11/4094 |
| 2018/0181344 A1 | 6/2018 | Tomishima et al. | |
| 2020/0098417 A1 | 3/2020 | Brox et al. | |

OTHER PUBLICATIONS

U.S. Appl. No. 16/138,345, titled "Memory Devece With Improved Writing Features", filed Sep. 21, 2018, pp. all.

* cited by examiner

*Primary Examiner* — Tri M Hoang
(74) *Attorney, Agent, or Firm* — Dorsey & Whitney LLP (57) ABSTRACT

The present invention relates to a method of performing a write access phase for a memory device and comprising:
transferring a write data from a local input and output line to a bit line to write the data into a memory cell via the bit line by activating a column switch provided between the bit line and the local input and output line during a first period; and
transferring a read data read out from the memory cell to the local input and output line via the bit line by activating the column switch during asecond period;
wherein the first period is longer than the second period.

20 Claims, 6 Drawing Sheets

MEMORY DEVICE WITH IMPROVED WRITING FEATURES

CROSS-REFERENCE TO RELATED APPLICATION

This application is a continuation of U.S. patent application Ser. No. 16/138,346, filed Sep. 21, 2018 and issued as U.S. Pat. No. 10,726,905 on Jul. 28, 2020. The aforementioned application, and issued patent, is incorporated by reference herein in its entirety and for all purposes.

TECHNICAL FIELD

The present invention relates to memory devices and, in particular but not exclusively, to memory devices having improved writing features.

BACKGROUND OF THE INVENTION

Memory devices are well known in the electronic field to store and allow accessing to digital information.

Dynamic Random Access Memory (DRAM) is a volatile memory wherein each bit of data is stored in a capacitor and the two possible states of the capacitor, charged or discharged, are conventionally assigned the two logic values of a bit "0" or "1". Since the electric charge on the capacitors may slowly leak off, DRAM requires an associated refresh circuit which periodically rewrites the data in the capacitors.

One of the largest applications for DRAMs is the use in graphic cards and video game consoles as graphic memories or in portable or stationary devices as main memory.

DRAMs include memory cells of great structural simplicity with only one transistor and a capacitor per cell and for this reason may reach a very high density; however, it requires also a more complex circuitry and timing if compared to other memory devices.

In particular, the write access time is one of the most relevant limitation for the speed and performances of these memory devices since it depends from a complex series of actions that must be completed before a data can be written into a memory cell.

The write access time is given by the combination of more than one timing parameter and one of them of main importance is the minimum column-to-column command timing (known as tCCD or column-to-column delay) or, in other words, the minimum time required to complete a column access of the memory matrix. This parameter is generally set as a multiple of the clock cycle tCK, for instance tCCD may be equal to two clock cycles. At a given column-to-column delay, a limitation in the performances of the memory device is the speed of the write access phase to the sense amplifier.

DETAILED DESCRIPTION

As it will be described in greater details hereinafter, the technology disclosed herein relates to memory devices as well as to systems including memory devises. Moreover, the technology involving the present invention relates also to methods for implementing a timing control for the writing and reading access phases to the above-mentioned memory devices.

As an example, the memory devices involved by the technology or the invention herewith disclosed may be a DRAM device even if this indication should not be considered a limitation of the Applicant's rights since the invention may be implemented on other RAM devices.

More specifically the invention may be implemented for example in the new modern families of memory devices known as: Graphic Double Data Rate GDDR or High Bandwidth Memories, for instance the families GDDR6 or HBM2.

Just for explanation purposes, it may be notes that DDR SDRAM memory are semiconductor chips having either 4b, 8b, 16b or 32b datapath. These component packages usually contain only one chip inside, but can have more if you need higher capacity.

The known families of DDRx SDRAMs may use one of the most advanced organization technology and use data bursts to improve data throughput. When a memory controller issues a read operation, the DRAM ICs return the requested column address as well as several adjacent addresses. This is called the prefetch depth. DDR SDRAM has a prefetch buffer of 2n, which means it returns two words for each read operation. DDR2 SDRAM has a prefetch buffer of 4n, which means that it returns four words for every read operation. DDR3 SDRAM and DDR4 SDRAM have prefetch buffers of 8n, so they return eight words for every read operation. The order words that are returned (burst order) in DDR3 SDRAM depend on the lower three bits of the column address. GDDR SDRAM have prefetch buffers of 8n or 16n.

As already reported, tCCD is the minimum amount of time between column operations. Subsequent reads to the same bank must be at least Tburst ns (or equivalent cycles) apart because it takes at least Tburst to transfer the burst from the prefetch buffer to the I/O bus. On DDR3, Tburst is four cycles (two transfers per cycle*four cycles=eight transfers); however, in some architectures tCCD may be greater than Thurst; it cannot however be less than Tburst. On GDDR Tburst is two cycles.

The present invention may be applied also an alternative memory structure such as a HBM memory. HBM memory is still DRAM on the inside of the chip, meaning the bitcell is the same, but other memory components are different. HBM is defined as a stack of HBM die where the dies are connected using Through Silicon Via (TSV) interconnect. The interconnection of the die is used to build wide bus architectures.

Notwithstanding these architecture differences, the present invention may be implemented on both kind or families of memory devices since it relates to a new write scheme that enables a shorter tCCD, as will be understood in the following lines.

In the following description we will focus our attention mainly on the GDDR memories with the only purpose of simplifying the description of the invention. It should be further noted that those GDDR memories may or may not have a dual channel architecture. The present invention is independent from this feature and may be applied also to memory devices having a dual channel architecture.

The present invention may be quickly defined as a high-speed core write scheme for the all above-mentioned memory devices.

For a better understanding of the technology to which the invention is applied we will first disclose the main architecture of a semiconductor memory device shown in the enclosed drawings.

Figure 1:
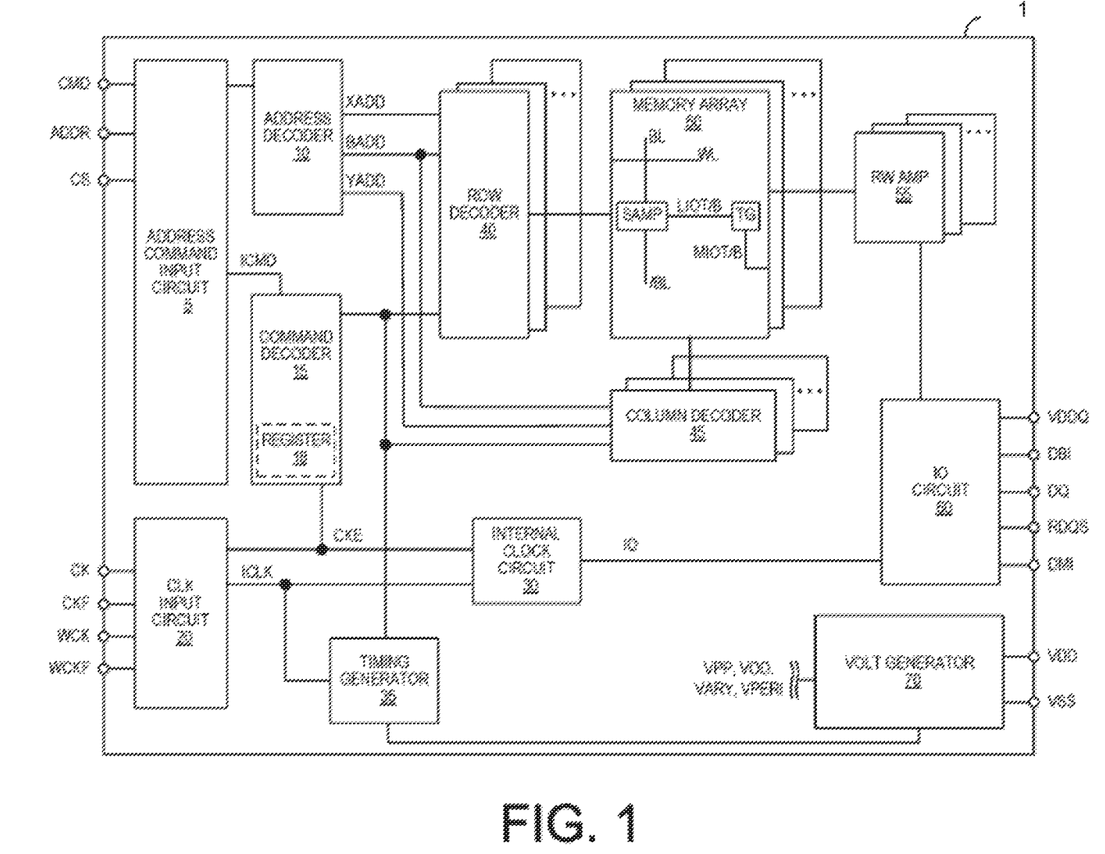
FIG. 1 is an example of a block diagram of a memory device realized according to one embodiment of the present technology and wherein a method of the present invention may be implemented.

Making now reference to FIG. 1, it may be appreciated the presence of a main block diagram showing a memory device 1 wherein at least one embodiment of the present invention is implemented.

This memory device 1 is a schematic 2D representation of a semiconductor device that may be considered a volatile memory for instance a dynamic random access memory of the DRAM type, for instance a GDDR SDRAM memory.

The memory device 1 can be connected to any one of a number of electronic devices capable of utilizing memory for the temporary or persistent storage of information, or a component thereof. For example, a host device of memory device 1 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 1, although in other embodiments, the host device may be indirectly connected to memory device (e.g., over a networked connection or through intermediary devices).

The memory device 1 may include an array of charge storage cells. This array is indicated in FIG. 1 with the numeral 50 but it should be considered that the array is structured with a plurality of memory banks, for instance sixteen banks. An array is a two dimensional matrix including normally at least 512×512 bits, or can be bigger depending on the used technology.

Each bank may be considered a memory matrix including thousands of memory cells. A simple cell of the matrix may include just one capacitor and one transistor per data bit.

However, memory cells can include any one of a number of different memory media types such as, for instance, capacitive, magnetoresistive, ferroelectric, phase change, or the like.

In each array 50 the long horizontal lines connecting each row of the memory matrix are known as word lines (WL) while the column of cells of the memory matrix are known as bit lines (BL). Each memory cell may be identified at the intersection of a word line WL and a bit line BL.

Figure 3:
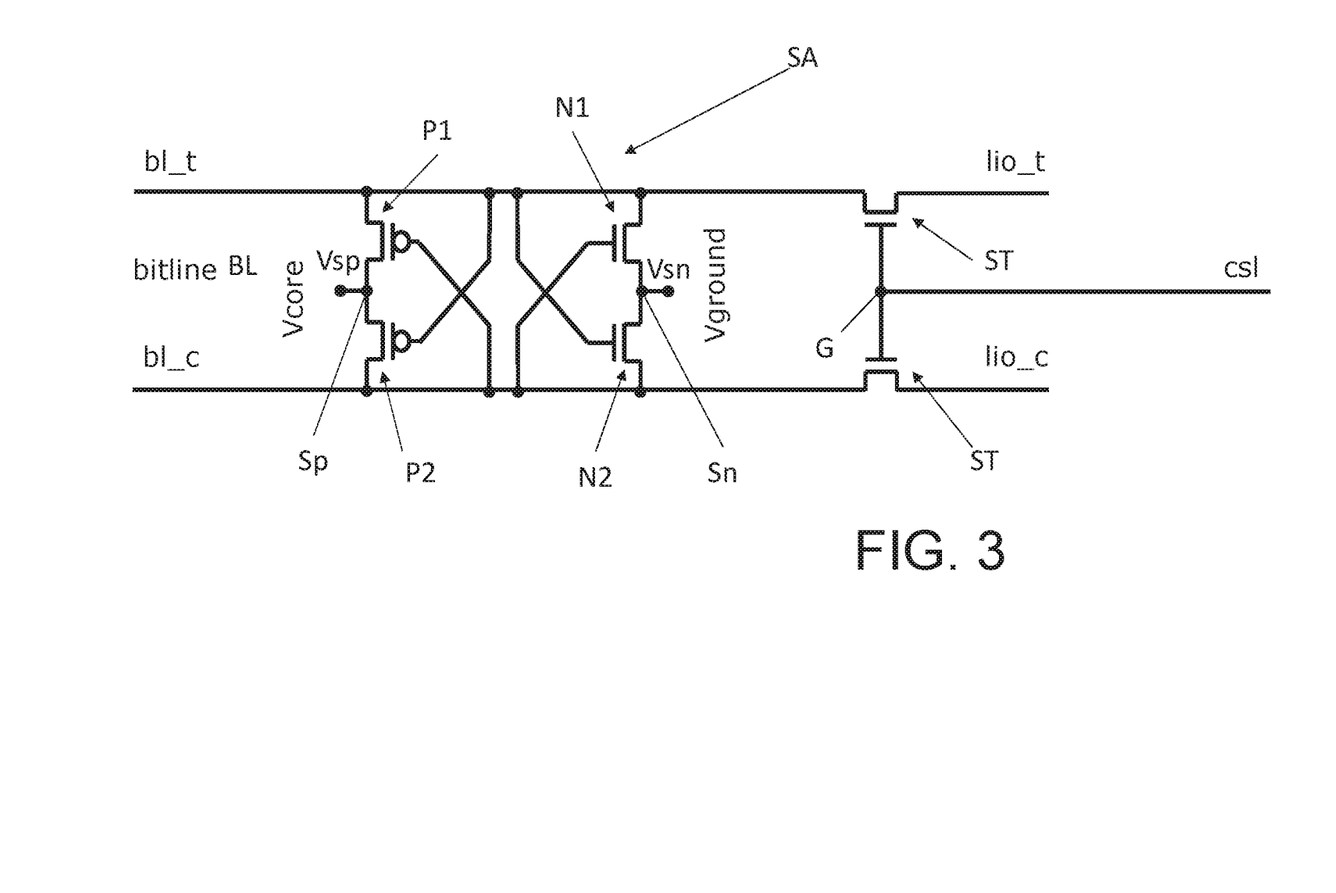
FIG. 3 shows another portion of the memory device of FIG. 1 used for implementing the method of the present invention.

More specifically, each column of cell may include a pair of bit lines bl_t and bl_c that are connected to a sense amplifier SAMP as shown in FIG. 3. A sense amplifier SAMP is generally provided for each bit line pair BL. A sense amplifier is essentially a pair of cross-connected inverters between the pair of bit lines bl_t and bl_c.

The selection of a word line WL may be performed by a row decoder 40. Similarly, the selection of a bit line may be performed by a column decoder 45.

Sense amplifiers SAMP may be provided for each corresponding pair of bit lines bl_t and bl_c and connected to at least one respective local I/O line pair (LIOT/B) which may in turn be coupled to at least respective one main I/O line pair (MIOT/B) via transfer gates TG. Those gates TG may operate as switches.

The memory array 50 may include plate lines and corresponding circuitry for managing their operation but this is not so relevant for the purpose of the present invention.

A plurality of external terminals is associated to the memory device 1. These terminals include command and address terminals coupled to a command bus or an address bus to receive command signals CMD and address signals ADDR, respectively. The command and address terminals may be supplied with address signals and memory bank address signals from outside. Those address signals supplied to the address terminals are then transferred to an address decoder to via a command/address input circuit 5.

A command signal may also be generated as an internal command signal ICMD to a command decoder 15 via said command/address input circuit 5. In such a case various internal command signals may be generated for performing memory operations. The command decoder 15 may include a register 18 to store and track various count values generated during refresh operations of the memory device 1.

The internal command signal ICMD may include activation commands to generate for instance a clocked command CKE.

The address decoder to is coupled to both the row decoder 40 and to the column decoder 45. The address decoder to can supply a decoded row address signal (XADD) to the row decoder 40 as well as a decoded column address signal (YADD) to the column decoder 45. The address decoder to can also receive a bank address signal (BADD) to supply to both the row decoder 40 and column decoder 45.

It should be noted that the memory device 1 may include also a chip select terminal to receive a chip select signal CS and clock terminals to receive clock signals CK and CKF.

The command signals CMD, the address signals ADD and the chip select signal CS may be supplied to the memory device by a conventional memory controller not shown in the drawings.

When an active CS signal is provided to the memory device 1 then the command and address signals may be decoded and memory operation may be performed.

Other terminals are visible in FIG. 1 and may be grouped in: data clock terminals to receive data clock signals WCK and WCKF, data terminals DQ, RDQS, DBI and DMI, power terminals VDD, VSS, VDDQ, VSSQ. The data terminals and the power terminal VDDQ are coupled to an input/output circuit 60.

The clock terminals and data clock terminals may be supplied with external clock signals and complementary external clock signals. The external clock signals CK, CKF, WCK, WCKF can be supplied to a clock input circuit 20. The CK and CKF signals can be complementary, and the WCK and WCKF signals can also be complementary. Complementary clock signals can have opposite clock levels and transition between the opposite clock levels at the same time.

The clock input circuit 20 can receive the external clock signals to generate internal clock signals ICLK. The internal clock signals ICLK can be supplied to an internal clock circuit 30. The internal clock circuit 30 can provide various phase and frequency controlled internal clock signal based on the received internal clock signals ICLK and a clock enable signal CKE from the command decoder 15.

With respect to the clock signals it must be noted that the memory device 1 can exchange data with other devices or circuits through the DQ data terminals. The data exchange requires an access time that is amount of time needed to get stable output after a change in address and may depend from another time parameter such as the column-to-column delay tCCD that is the minimum amount of time between column operations. The access time and/or the column-to-column delay tCCD may have to account for worst-case propagation delay between the memory array 50 and the DQ ports.

One of the purposes of the present invention is that of providing a write access scheme which enables a shorter column-to-column delay tCCD, as will be apparent in the following paragraphs.

To complete the description of the memory device 1 it must be remarked that the power supply terminals may be supplied with power supply potentials VDD and VSS that can be supplied to an internal voltage generator 70 capable in turn to generate various internal potential indicated in FIG. 1 as VPP, VOD, VARY, VPERI. Those potentials value may be used in the row decoder 40 in the memory array 50 or in other circuit blocks.

The power supply terminals may also be supplied with power supply potential VDDQ that can be supplied to the input/output circuit 60 together with the power supply potential VSS to reduce power supply noise. The power supply potential VDDQ can be the same potential as the power supply potential VDD or can be a different potential.

When a read command is issued and a row address and a column address are timely supplied with the read command, read data can be read from memory cells in the memory array 50 designated by these row address and column address. The read command may be received by the command decoder 15, which can provide internal commands to input/output circuit 60 so that read data can be output from the data terminals DQ, RDQS, DBI, and DMI via read/write amplifiers 55 and the input/output circuit 60 according to the RDQS clock signals.

The read data may be provided at a time defined by a predetermined read latency information RL that can be programmed in the memory device 1.

The read latency information RL can be defined in terms of clock cycles of the CK clock signal. For example, the read latency information RL can be a number of clock cycles of the CK signal after the read command is received by the memory device 1 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 15, which can provide internal commands to the input/output circuit 60 so that the write data can be received by data receivers in the input/output circuit 60 and supplied via the input/output circuit 60 and the read/write amplifiers 55 to the memory array 50. The write data may be written in the memory cell designated by the row address and the column address. The write data may be provided to the data terminals at a time that is defined by write latency WL information. The write latency WL information can be programmed in the memory device 1.

The write latency WL information can be defined in terms of clock cycles of the CK clock signal. For example, the write latency information WL can be a number of clock cycles of the CK signal after the write command is received by the memory device too when the associated write data is received.

In this specific example we will take in consideration memory devices having a column access completed in two clock-cycles. In other words, two clock signals 2CK are required to finish a column access and we may consider that for these memory devices there is a coincidence between the time tCCD and two clock cycles: tCCD=2CK Making now reference to FIG. 2, it is shown a schematic example of the structure of a portion of the memory array 50 that will be identified with the number 100.

Figure 2:
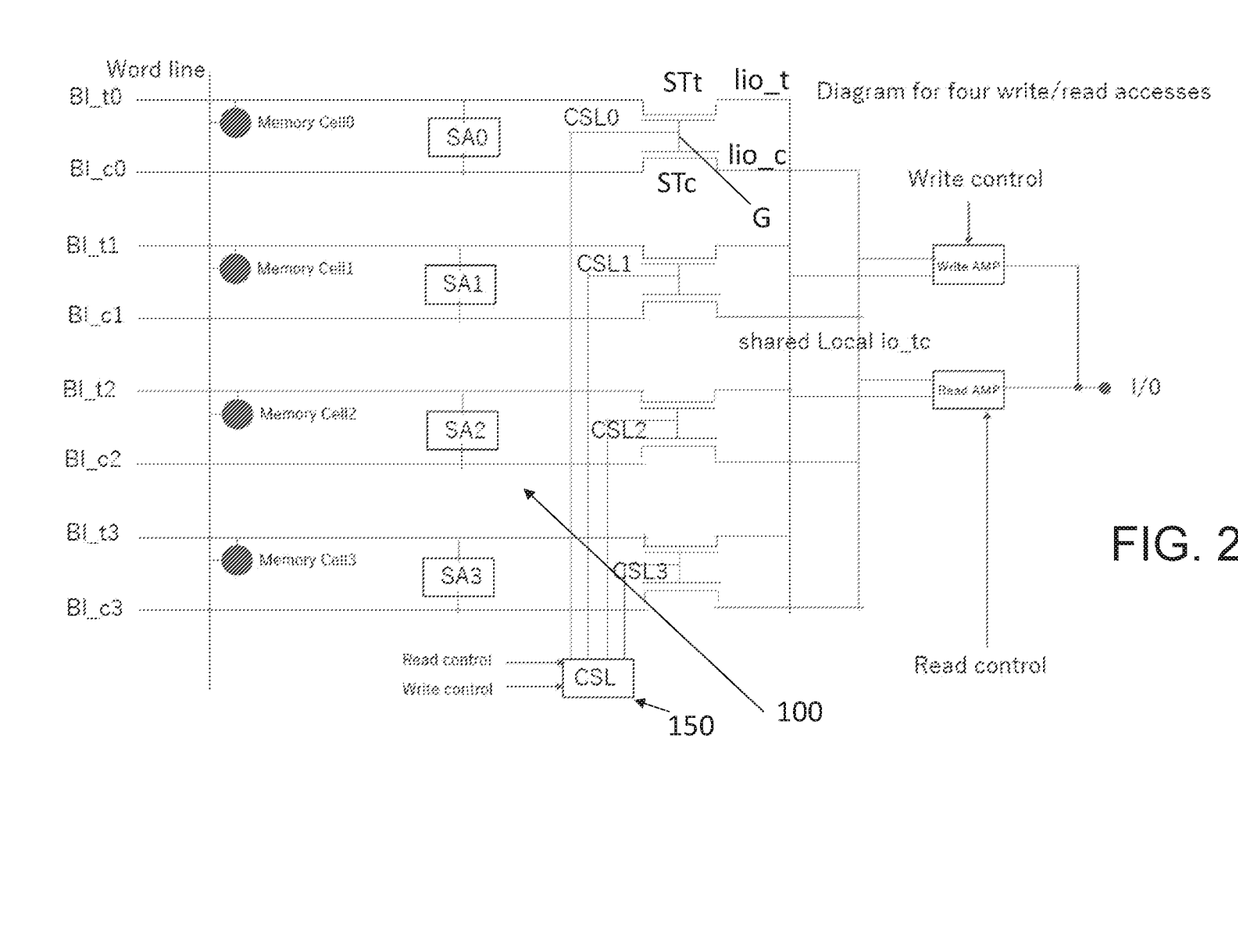
FIG. 2 shows an example of a detailed diagram of a portion of the memory device of FIG. 1.

This memory portion too include only four memory cells: Memory Cell0, Memory Cell1, Memory Cell2 and Memory Cell3 each connected to a same Word Line WL but associated to a corresponding Bit Line.

Therefore, only four Bit Lines are visible in FIG. 2, namely: Bl_t0, Bl_t1, Bl_t2 and Bl_t3 as well as corresponding differential sense amplifiers SA0, SA1, SA2 and SA3. Bl_c0, Bl_c1, Bl_c2 and Bl_c3 are the four corresponding reference Bit Lines connected to the same sense amplifiers but disconnected from memory cells by a closed word line. Information is read from the cell, or written into the cell, by the sense-amplifiers SA.

From a physical point of view the Bit Lines are semiconductor stripes that are perpendicular to the Word Lines and are connected to the source or drain terminal of the cell-transistors. In other words, the bit-lines are the lines through which information is written/read to/from the memory cells.

An example of a sense-amplifier SA of known structure is shown in FIG. 3 wherein the pair of Bit Lines bl_t and bl_c are connected to the terminals of the pMOS and nMOS transistors incorporated into the sense amplifier SA.

Essentially, each sense amplifier SA is an analog differential amplifier that may be activated during the reading and writing phases of the memory cells.

As it is well known, a sense amplifier is part of the read/write circuitry that is used when data is read or written from the memory cells. The role of the sense amplifier is that of sensing the low power signals from the Bit Line that represents a data bit (1 or 0) stored in a memory cell, and that of amplifying the small voltage swing to recognizable logic levels so the data can be interpreted properly by the logic circuitry outside the memory array.

FIG. 3 shows an example of a sense amplifier SA wherein a first inverter including a couple of pMOS transistors P1, P2 is connected between the connecting lines bl_t and bl_c of the Bit Line pair BL The pMOS transistors P1, P2 have the source terminal Sp in common.

The gate terminals of these pMOS transistors P1, P2 are cross connected to a respective connecting bit line bl_t or bl_c.

Similarly, a second inverter including a couple of nMOS transistors N1, N2 is connected between the connecting lines bl_t and bl_c of the Bit Line pair. The nMOS transistors N1, N2 have the source terminal Sn in common.

The gate terminals of these nMOS transistors N1, N2 are cross connected to a respective connecting bit line bl_t or bl_c.

The sense amplifier SA coupled to the Bit Line pair BL is also coupled to at least one pair of local I/O lines lio_t and lio_c.

Between the sense amplifier SA and each local I/O line lio_t or lio_c there is a selection transistor STt and STc, respectively. In particular these selection transistors are nMOS transistors receiving on their respective common gate terminals G a column-select pulse signal csl that will be explained hereinafter.

Each pair of local I/O lines lio_t or lio_c is coupled to at least one respective main I/O line via a Read Amplifier and a Write Amplifier, as shown in FIG. 2. Shared local I/O lines lio_t and lio_c are connected to a common Read Amplifier and to a common Write Amplifier.

Coming back to the structure of the sense amplifier SA, a voltage potential Vsp is applied on the source terminal Sp of the first inverter during the read and write access phase to the memory cell.

A voltage potential Vsn is applied on the source terminal Sn of the other inverter during the read and write access phase to the memory cell.

More particularly, during the write access phase the sense amplifier SA is activated and a high voltage value Vcore is applied to the source terminal Sp so that in these conditions Vsp=Vcore.

At the same time, a low voltage value Vground is applied to the other source terminal Sn so that Vsn=Vground.

The column-select line signal csl applied to the gate G of the selection transistors STt or STc is driven to a high voltage value.

It is worthwhile to note that the width of the csl-pulse is identical for both the write and the read access phases.

Let's now consider a write access phase wherein data must be provided by the memory controller, driven through the data bus, passed through the I/O gating to the sense amplifiers and finally stored in the memory cell.

At the end of the path the data to be written is driven on the local I/O lines lio_t and lio_c.

The signals of these local I/O lines lio_t and lio_c are written via the selection transistors STt and STc into the sense amplifier SA when the csl-pulse applied to the gate terminal G of the nMOS selection transistors STt and STc is driven to a high voltage value.

However, as those skilled in this art know very well, the write time that is needed to complete a write access phase must be long enough to allow the Bit Lines to reach the desired charge state.

As we have seen in the preamble of the present specification, the write time to the sense amplifier is a relevant limitation for the speed and performances of a memory device.

For instance, when a write command is issued at a memory controller and a row address and a column address are timely supplied to the terminals ADDR with this command, write data can be supplied to the data terminals DQ, DBI, and DMI according to the WCK and WCKF clock signals. The write command may be received by the command decoder 15 which can provide internal commands to the input/output circuit 60 so that the data to be written can be received by data receivers in the input/output circuit 60 and supplied via the read/write amplifiers 55 to the memory array 50.

The write data may be written in the memory cell designated by the row address and the column address. The write data may be provided to the data terminals at a time that is defined by write latency WL information. The write latency WL information can be programmed in the memory device 1 and can be defined in terms of clock cycles of the CK clock signal. For example, the write latency information WL can be a number of clock cycles of the CK signal after the write command is received by the memory device 1 when the associated write data is received.

Figure 4:
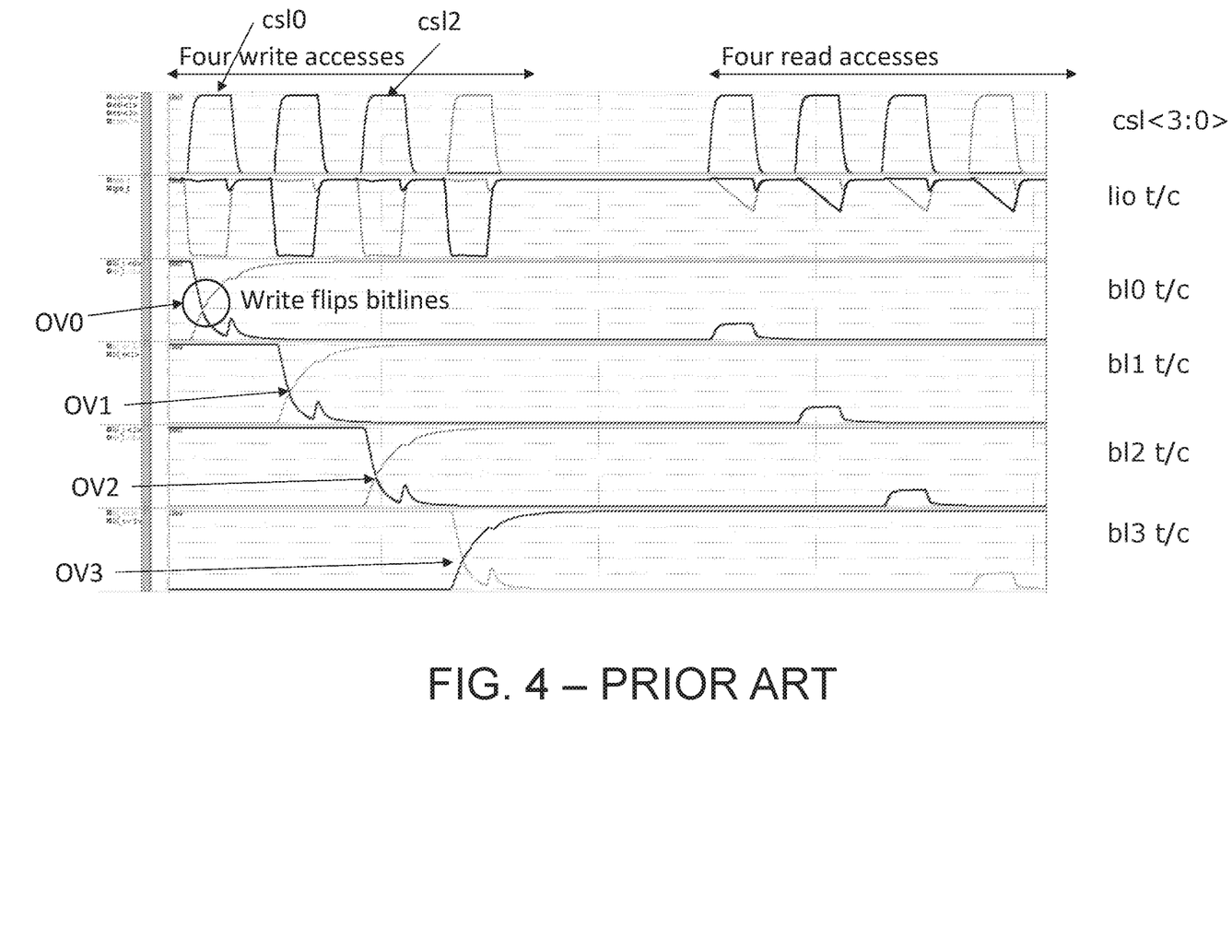
FIG. 4 illustrates a timing diagram for a memory portion of known prior art equivalent to the memory portion shown in FIG. 2 on which a known read and write access method is applied at a low frequency.

In this respect, it's important to make reference to FIG. 4 wherein it is initially illustrated a conventional approach for a write access phase followed by a conventional read access phase for the simple example of the four cells memory array illustrated in FIG. 2.

The diagrams shown in FIG. 4 reports the shape vs. time of various signals that are present on the I/O lines and on the Bil Lines BL during the write and read access phases. It should be further noted that the diagram of FIG. 4 has been taken for a write or read access phase performed at low frequency. The diagram of FIG. 4 is just for explanation purposed and does not report a time scale; this is also true for the diagrams of the FIGS. 5 and 6.

Now, as it may be appreciated, the csl-pulse signal is activated for a duration corresponding to one clock cycle tCK for both write and read phases.

The various csl-pulses: csl0, csl1, csl2 and csl3 are separated in time and regularly spaced so that the raising edge of a single pulse signal is generated only after the falling edge of the previous pulse is over. They are non-overlapping.

Comparing now the corresponding signal waveforms on the different bit lines bl_t0 and bl_c0 after the sense amplifier SA0 we may realize that the time duration of the csl-pulse allows the bit lines to be correctly flipped—OVo— in the given time by local I/O lines. This means that the write access has been correctly performed.

This situation is correctly propagated in time according to the different csl-pulses as shown by the other waveforms OV1, OV2 and OV3 for the little array of four memory cells.

The read access phase is reported in the subsequent portion of the diagram and is performed in a conventional manner.

The situation is however different if the write access phase is performed at high frequency. This situation is simplified in the series of diagrams illustrated in FIG. 5 always relating to the little exemplary array of four memory cell shown in FIG. 2.

Figure 5:
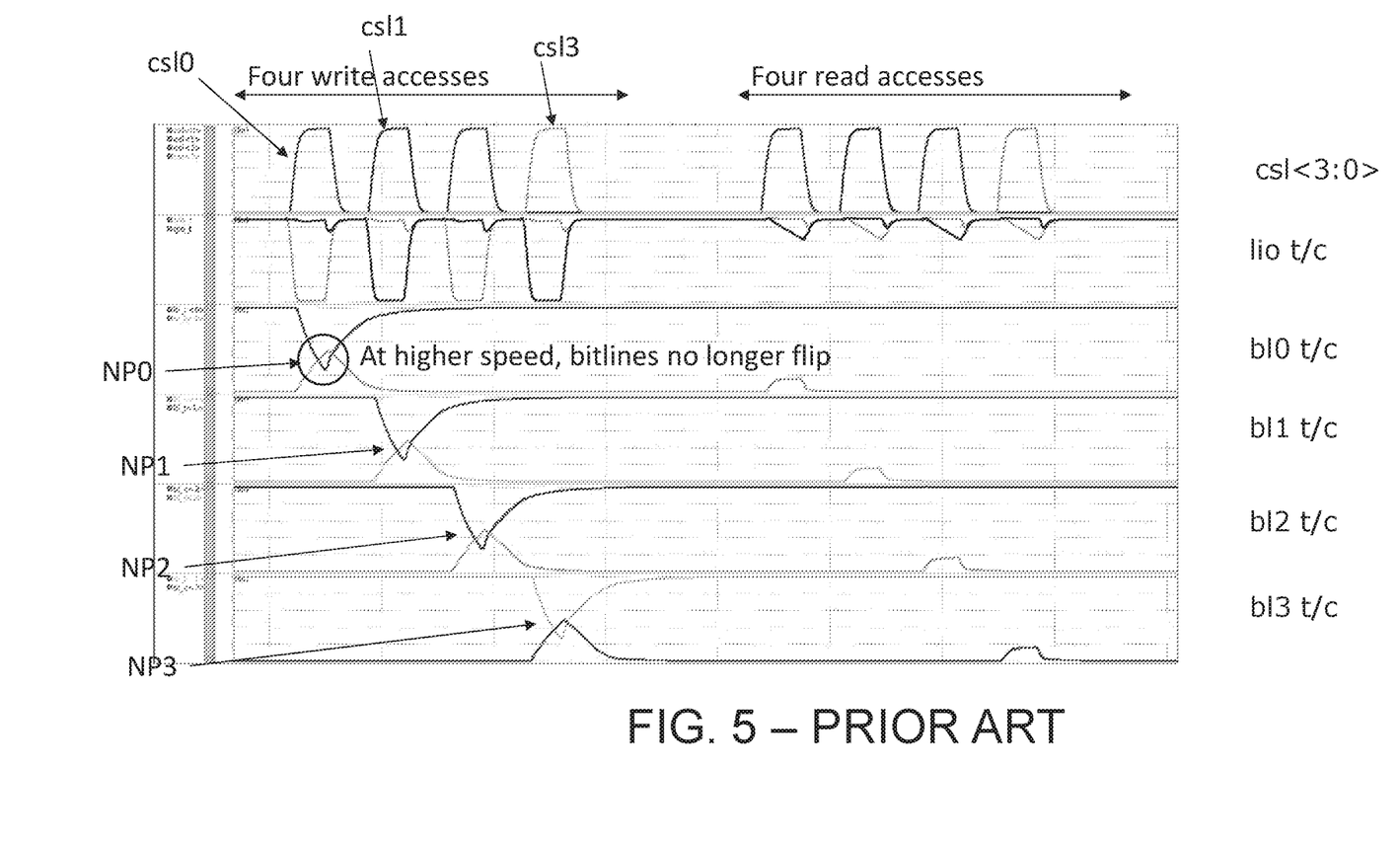
FIG. 5 illustrates a timing diagram for a memory portion of known prior art equivalent to the memory portion shown in FIG. 2 on which a known read and write access method is applied at a high frequency.

As may be appreciated by the first diagram, the csl-pulse signal is shorter than in the previous example since the access phase is performed at higher frequency.

The pulses however are still well separated one from the other and the raising edge of a pulse is generated only when the falling edge of the previous pulse is over.

Again, the second diagram shows the corresponding write data signal reproduced in a differential manner on the local I/O lines lio_t or lio_c.

The third diagram reports the signal waveforms on the different bit lines bl_t0 and bl_c0 connected to the sense amplifier SA0.

At this higher speed the bit lines no longer flip as may be seen from the completely different overlapping portion NP0 of the signal waveforms.

This situation is propagated in time according to the different csl-pulses csl1, csl2 and csl3 as shown by the other overlapping trends NP1, NP2 and NP3.

The result of this approach at higher frequency is an undesired fail of the write access since the write data is no longer passing to the sense amplifier SA.

In other words, in the situation simplified by the diagrams shown in FIG. 5, the bit lines cannot be flipped by the local I/O lines in the given time frame set by the csl-pulse signal. The result of this failure is a serious drawback for the memory device that cannot be correctly written at high frequencies.

On the contrary and advantageously the present invention provides for a new and inventive write scheme allowing to complete a correct write access phase even at high frequencies.

Figure 6:
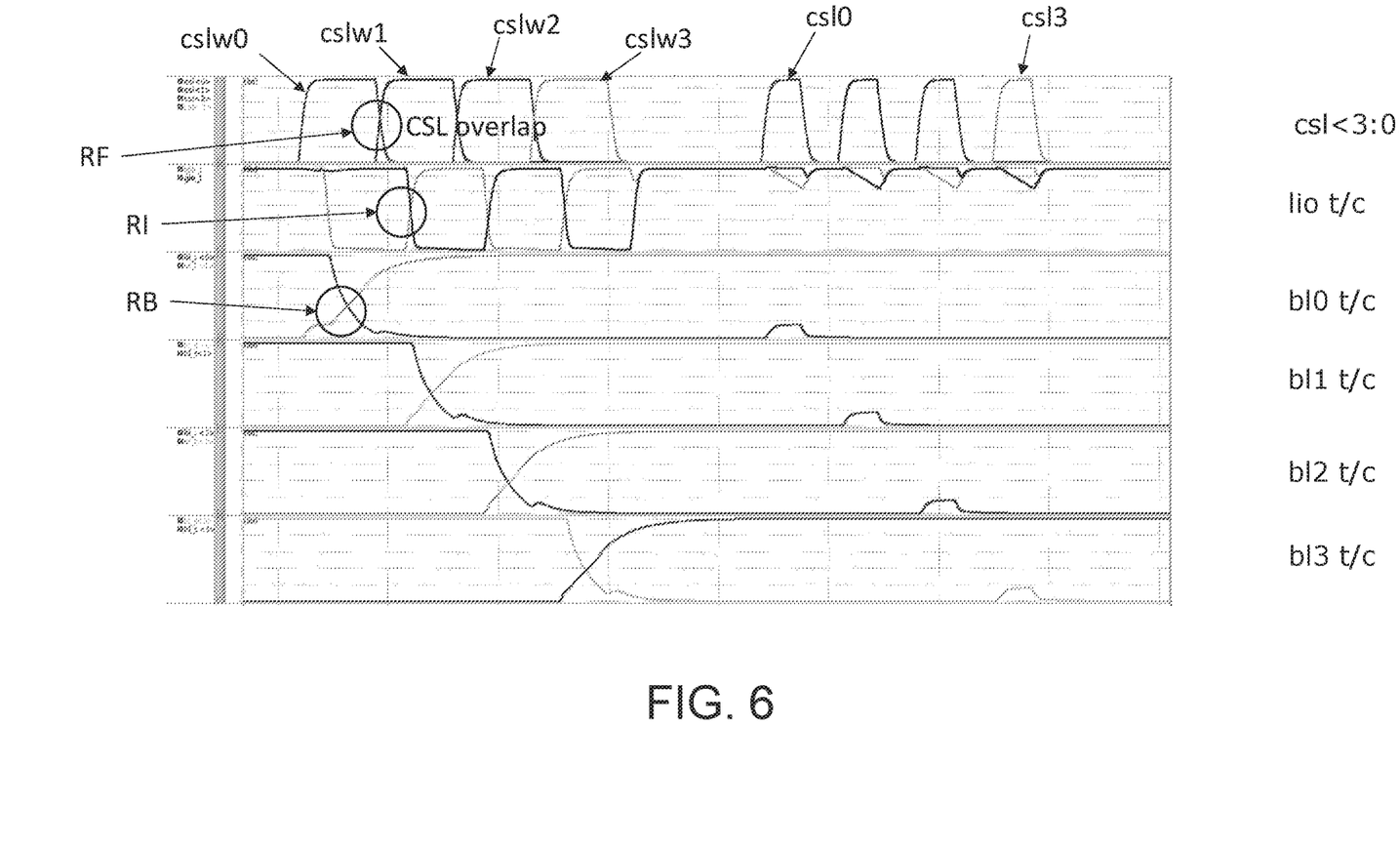
FIG. 6 illustrates a timing diagram for the memory portion shown in FIG. 2 in accordance with an embodiment of the present invention.

This new scheme is illustrated in the schematic diagrams reported in FIG. 6.

As may be appreciated in the first diagram the csl-pulse has been extended if compared with the prior art approaches previously disclosed.

More specifically, the csl-pulse has been widened so to reach a duration substantially corresponding to a couple of clock cycles.

If the duration of the csl-pulse disclosed in the examples of the FIGS. 4 and 5 can always be referred to a single clock cycle, so that the csl-pulse is as long as a clock cycle tCK, then in the example of FIG. 6 the duration of the csl-pulse cslw corresponds to two clock cycles, so that csl-pulse cslw is as long as two clock cycles i.e. 2 tCK.

The diagram reports that the write access phase is performed correctly as clearly shown by the signals on the bit lines, for instance the overlapping point RB on the third diagram referring to the first bit line pair blo_t/c is correctly written.

It should be further noted that such an extended duration of the csl-pulse cslw signal has been adopted for the write access phase only, in the sense that the duration of the csl-pulse for the read access phase has been kept corresponding to a single clock cycle.

This difference is clearly visible in the first diagram of FIG. 6 wherein the width of the write access pulse cslw is larger than the width of the read access pulses csl.

More particularly, the four csl-pulses cslw for the write access are 2 tCK wide while the csl-pulses csl for the read access are 1 tCK wide.

It is worthwhile to note that the widened csl-pulses cslw partially overlap one with the other. In other words, the rising edge of a subsequent pulse cslw is generated when the falling edge of the previous pulse cslw is not yet over.

For instance, the cslw0 pulse overlaps the subsequent cslw1 pulse and so on up to the cslw3 pulse.

This happens independently from the set frequency since the duration of these pulses cslw is the double of the clock pulse tCK.

This overlapping situation has been identified in the FIG. 6 by the circle RF.

In the second diagram relating to the signals present on the local I/O lines the overlapping situation is indicated by the circle RI showing that the data from a previous access can be driven while the subsequent cslw pulse is already raising.

This is another important feature to be remarked the new timing control provided by the present invention allows the column-select pulses cslw of different columns to overlap during the write access phase but this situation has no drawbacks at all since the data are enabled to be driven to the sense amplifier while the current csl pulse is falling and the subsequent pulse cslw is rising.

In other words, this situation is a further advantage of the present invention since the I/O lines do not move at all when a new data to be written is equal to a previous data. On the long run of the use of the memory device this situation will save the overall power consumed by the semiconductor device.

The csl-pulses cslw for the new write access scheme of the present invention are generated by the CSL block 150 shown in FIG. 2. This block 150 receives as inputs the Read Control and the Write Control signals that are normally applied to the Write and Read Amplifiers. The block 15 may be included in the column decoder 45. The read and write controls may be obtained from the read and write command information from the command decoder 15, the address information BADD, YADD from the address decoder 10 and internal clocks output from the timing generator 35. That is, the column decoder internally produces the read and write control signals for the block 150.

The Write Amplifier 200 is shown in FIG. 2 coupled to the main I/O line and to the shared local I/O lines and receives the Write Control signal applied also to the CSL block 150.

Similarly, the Read Amplifier 300 is shown on its turn coupled to the main I/O line and to the shared local I/O lines and receives the Read Control signal applied also to the CSL block 150.

Therefore, the CSL block may regulate the time duration of the csl-pulse csl or cslw according the Read or Write Control signal received. In other words, this column-select CSL block 150 is provided to be coupled to the sense amplifiers and for generating said column-select pulse signal csl or cslw enslaved to the receipt of a read or write control signal.

In order to summarize the features of the present invention we will now focus the attention on the phases of the method of performing a write access phase for the memory device 1 previously disclosed.

In more general sense, the memory device 1 may be considered a memory cell array including a plurality of memory cells structured in a matrix of bit lines and word lines and wherein said bit lines are coupled to local I/O lines through a corresponding sense amplifier SA receiving a data to be written in a memory cell.

In the structure of the memory device a generic column-select line csl (FIG. 2) is coupled to the sense amplifier SA for receiving a column-select pulse signal cslw enabling the sense amplifier to receive the data to be written.

The clock input circuit 20 may receive or generate at least a clock pulse signal CK for regulating the timing access to the memory device.

Advantageously, according to the invention said column-select pulse signal cslw is extended for a duration longer than said clock signal.

However, it is important to note that said column-select pulse signal is extended for the write access phase only.

In fact, the timing control for the write and read access phases of the memory cells thought said sense amplifiers SA are kept different or differentiated regulating the duration of said column-select pulse signal cslw.

More specifically, the time duration of said column-select pulse signal correspond to the column-to-column delay (tcslw=tCCD) and is set to the double of said clock pulse signal tCK in the example of GDDR DRAM.

On the contrary, the duration of said column-select pulse signal corresponds to the duration of said clock pulse signal tCK during the regular read access phase.

Said differently, while the duration of said column-select pulse signal is regulated to correspond to the double of said clock pulse signal during the write access phase, the duration of said clock pulse signal is kept equal to the duration of the clock pulse signal during the read access phase.

This approach generates diagram layout shown in FIG. 6 wherein it may be appreciated that the subsequent column-select pulse signals partially overlap during the write access phase.

That is to say: the column-select pulse signals pertinent to different columns of the memory matrix partially overlap during the write access phase. On the contrary, in the read access phase the sequence of the column-select pulses proceeds regularly.

This situation has a further advantage due to the fact that the data to be written of a previous write access phase is enabled to be driven to the sense amplifier when the subsequent column-select pulse signal is already raising.

Finally, it should be remarked that the method of the present invention may be implemented on various memory devices such as for example: DDRx SDRAMs or GDDRx SDRAMs or HBM semiconductor memory devices.

From a structure point of view the present invention relates to a new memory device comprising at least a memory cell array including a plurality of memory cells structured in a matrix of bit lines and word lines and wherein said bit lines are coupled to local I/O lines through a corresponding sense amplifier receiving a data to be written in a memory cell;

A column-select line is coupled to the sense amplifier for receiving a column-select pulse signal enabling the sense amplifier to receive said data to be written.

A timing regulator is provided for receiving or generating at least a clock pulse signal for regulating the timing access to the memory device; and a column-select pulse signal regulator is provided for regulating the duration of the column-select pulse signal during the write access phase to the memory cells.

The invention achieves many advantages the most important of which is given by the possibility to regulate independently the write and read access phase to the memory device.

The invention enables a shorter column-to-column access time while allowing to complete the write access phase in a safe manner without affecting the quality of the stored data.

In accordance with at least one aspect of the claimed subject matter it is disclosed a method of performing a write access phase for a memory device comprising at least a memory cell array including a plurality of memory cells structured in a matrix of bit lines and word lines and wherein said bit lines are coupled to local I/O lines through a corresponding sense amplifier receiving a data to be written in a memory cell;
a column-select line is coupled to the sense amplifier for receiving a column-select pulse signal enabling the sense amplifier to receive said data to be written;
at least a clock pulse signal is present for regulating the timing access to the memory device while said column-select pulse signal is extended for a duration longer than said clock signal.

In accordance with at least another aspect of the claimed subject matter it is further disclosed a memory device comprising at least a memory cell array including a plurality of memory cells structured in a matrix of bit lines and word lines and wherein said bit lines are coupled to local I/O lines through a corresponding sense amplifier receiving a data to be written in a memory cell;
a column-select line is coupled to the sense amplifier for receiving a column-select pulse signal enabling the sense amplifier to receive said data to be written;
a timing regulator is provided for receiving or generating at least a clock pulse signal for regulating the timing access to the memory device;
a column-select pulse signal regulator is provided for regulating the duration of the column-select pulse signal during the write access phase to the memory cells setting a duration longer than said clock signal.

This timing regulation is obtained in an easy and effective manner acting on the column-select pulse signal regulator that issues the appropriate column-select pulse signal for the write access phase and the read access phase respectively.

Another advantage is due to the possibility to drive the data to be written from the previous access while the subsequent column-select pulse signal is already rising.

At the end this further advantage will allow to obtain a memory device having a reduced power consumption.

Tests and experimental results performed by the Applicant have shown that with the new write scheme of the present invention there is a dramatic reduction of the failures during the write access phase to the sense amplifiers of the memory device. This reduction is in percentage close to the 30% if compared to the convention approaches.

We claim:

1. An apparatus comprising:
a column-select pulse (CSP) signal regulator configured to regulate a duration of column-select pulse (CSP) signals during a write access phase to a selected memory cell, wherein the duration of the CSP signals is longer than a clock pulse signal and the CSP signals generated during the write access phase partially overlap.

2. The apparatus of claim 1, wherein the column-select pulse signal regulator receives as inputs a write control signal and a read control signal to select the duration of the column-select pulse signal in case of a write or read access phase.

3. The apparatus of claim 2, wherein the column-select pulse signal regulator generates the column-select pulse signal having a duration set to double said clock pulse signal when enabled by said write control signal.

4. The apparatus of claim 3, wherein the column-select pulse signal regulator generates the column-select pulse signal having a duration corresponding to a duration of the clock pulse signal when enabled by the read control signal.

5. The apparatus of claim 1, wherein outputs of the column-select pulse signal regulator are coupled to corresponding sense amplifiers to enable the sense amplifiers to receive a corresponding write data to be written.

6. The apparatus of claim 5 further comprising a plurality of column-select lines provided for the corresponding sense amplifiers, wherein a selected one of the plurality of column-select lines receiving the column-select pulse signal is configured to enable a transfer of write data from a local I/O line to a respective sense amplifier of the sense amplifiers.

7. The apparatus of claim 1, wherein the column-select pulse signal regulator generates the column-select pulse signal having a duration extended with respect to a duration of the clock pulse signal for the write access phase only.

8. A method comprising:
receiving a write control signal;
responsive to the write control signal, setting a duration of column-select pulse (CSP) signals longer than a clock pulse signal; and
providing each of the CSP signals for the duration, wherein the CSP signals partially overlap.

9. The method of claim 8, wherein the write control signal is received from a command decoder.

10. The method of claim 8, further comprising receiving the clock pulse signal from a timing generator.

11. The method of claim 8, wherein the each of the CSP signals is provided to at least one of a plurality of column-select lines.

12. The method of claim 11, wherein the at least one of the plurality of column-select lines is configured to, responsive to the CSP signals, enable a transfer of write data from a local I/O line to a respective sense amplifier.

13. The method of claim 8, further comprising:

receiving a read control signal;

responsive to the read control signal, setting a second duration of the CSP signals, wherein the second duration is shorter than the duration set responsive to the write control signal.

14. The method of claim 8, wherein the duration of the CSP signals corresponds to a column-to-column delay tCCD.

15. A method comprising:

transferring a write data from a local input and output line to a bit line to write the write data into a memory cell via the bit line by activating a column switch provided between the bit line and the local input and output line during a write period, wherein the activation of the column switch includes activating a column select pulse signal and subsequent column-select pulse signals partially overlap during a write access phase.

16. The method of claim 15, further comprising transferring a read data out from the memory cell to the local input and output line via the bit line by activating the column switch during a read period, wherein the read period is shorter than the write period.

17. The method of claim 16, wherein a duration of the write period is double the read period.

18. The method of claim 17, wherein the duration and the second duration are regulated independently.

19. The method of claim 15, wherein a duration of the write period corresponds to double a clock pulse signal during an access period.

20. The method of claim 15, further comprising enabling, responsive to the column-select pulse signals, a sense amplifier coupled to the local input and output line.

* * * * *